(12) United States Patent
Shen et al.

(10) Patent No.: US 8,984,217 B2
(45) Date of Patent: Mar. 17, 2015

(54) SYSTEM AND METHOD OF REDUCING POWER USAGE OF A CONTENT ADDRESSABLE MEMORY

(75) Inventors: Jian Shen, San Diego, CA (US); Dang D. Hoang, Austin, TX (US); Paul D. Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 454 days.

(21) Appl. No.: 12/862,277

(22) Filed: Aug. 24, 2010

(65) Prior Publication Data

US 2012/0054426 A1  Mar. 1, 2012

(51) Int. Cl.
| | |
|---|---|
| G06F 12/00 | (2006.01) |
| G06F 13/00 | (2006.01) |
| G06F 13/28 | (2006.01) |
| G06F 1/26 | (2006.01) |
| G06F 1/32 | (2006.01) |
| G11C 15/00 | (2006.01) |
| G11C 15/04 | (2006.01) |

(52) U.S. Cl.
CPC ..................................... *G11C 15/04* (2013.01)
USPC ........... 711/108; 711/165; 713/320; 365/49.1

(58) Field of Classification Search
USPC .................. 711/108, 165; 713/320; 365/49.1
See application file for complete search history.

(56) References Cited

U.S. PATENT DOCUMENTS

| | | | | |
|---|---|---|---|---|
| 7,100,013 | B1 * | 8/2006 | de Waal ......................... | 711/170 |
| 7,401,180 | B1 * | 7/2008 | James et al. ................... | 711/108 |
| 7,616,468 | B2 | 11/2009 | Chai et al. | |
| 2004/0128574 | A1 * | 7/2004 | Ricci et al. .................... | 713/320 |
| 2005/0160250 | A1 | 7/2005 | Yoshimi | |
| 2008/0005516 | A1 * | 1/2008 | Meinschein et al. .......... | 711/165 |
| 2012/0147680 | A1 | 6/2012 | Koike | |

FOREIGN PATENT DOCUMENTS

| | | |
|---|---|---|
| CN | 1354855 A | 6/2002 |
| JP | 2000149573 A | 5/2000 |
| JP | 2000228090 A | 8/2000 |

(Continued)

OTHER PUBLICATIONS

Cheng, et al., "Static divided word matching line for low-power content addressable memory design", Proceedings IEEE International Symposium on Circuits and Systems, May 23-26, 2004, pp. 629-632, vol. 2, XP010720415, ISBN: 978-0-7803-8251-0.

(Continued)

*Primary Examiner* — Michael Alsip
(74) *Attorney, Agent, or Firm* — Peter Michael Kamarchik; Nicholas J. Pauley; Joseph Agusta

(57) ABSTRACT

A system is disclosed that includes a content addressable memory and an input register coupled to the content addressable memory. The input register can store a data word and the content addressable memory determines if the data word exists in the content addressable memory. The system also includes a power control circuit coupled to the content addressable memory for selectively providing power to at least a portion of the content addressable memory. The system includes power control logic coupled to the power control circuit to selectively reduce power to the at least a portion of the content addressable memory when valid data does not exist in the at least a portion of the content addressable memory.

30 Claims, 4 Drawing Sheets

(56) References Cited

FOREIGN PATENT DOCUMENTS

| JP | 2001167585 A | 6/2001 |
|----|--------------|--------|
| JP | 2003045189 A | 2/2003 |
| JP | 2004164395 A | 6/2004 |
| KR | 100355169 | 10/2002 |
| WO | 2004104841 A1 | 12/2004 |
| WO | 2011027501 A1 | 3/2011 |

OTHER PUBLICATIONS

International Search Report and Written Opinion—PCT/US2011/048892—ISA/EPO—Nov. 2, 2011.

* cited by examiner

US 8,984,217 B2

SYSTEM AND METHOD OF REDUCING POWER USAGE OF A CONTENT ADDRESSABLE MEMORY

I. FIELD

The present disclosure is generally related to a system and method of reducing power usage of a content addressable memory.

II. DESCRIPTION OF RELATED ART

Content Addressable Memory (CAM) is a type of computer memory used for high-speed searching. Unlike random access memory (RAM) in which the user supplies a memory address and the RAM returns the data stored at that address, a CAM is designed such that the user supplies a data word and the CAM searches its entire memory to see if that data word is stored anywhere in it. If the data word is found, the CAM returns a list of one or more storage addresses where the word was found.

Because a CAM is designed to search its entire memory in a single operation, it can be much faster than RAM. To perform the search and detect a match, a CAM can have its own associated comparison circuits. The comparison circuits can detect a match between a stored bit in a cell and an input bit. Additionally, the comparison circuits can combine outputs from each cell in a data word to detect a data word match. The comparison circuits increase an amount of power used by the CAM because every comparison circuit is active on every clock cycle.

The amount of power used by a CAM can be significant, especially in portable personal computing devices that are powered by a battery. Since a CAM requires power to operate the comparison circuits every clock cycle, a portable personal computing device may consume more power and reduce the amount of time the battery can power the device.

Accordingly, it would be advantageous to provide an improved system and method of reducing power usage of a content addressable memory.

III. SUMMARY

In a particular embodiment, a system is disclosed that includes a content addressable memory and an input register coupled to the content addressable memory. The input register can store a data word and the content addressable memory determines if the data word exists in the content addressable memory. The system also includes a power control circuit coupled to the content addressable memory for selectively providing power to at least a portion of the content addressable memory. The system also includes power control logic coupled to the power control circuit to selectively reduce power to the at least a portion of the content addressable memory when valid data does not exist in the at least a portion of the content addressable memory.

In another particular embodiment, a method includes receiving an instruction to lookup an entry in a content addressable memory. The method also includes determining when valid data exists in at least a portion of the content addressable memory and implementing a power management technique when valid data does not exist in the at least a portion of the content addressable memory.

In yet another particular embodiment, a device includes a content addressable memory and a power control circuit coupled to the content addressable memory. The device also includes means for determining when valid data exists in at least a portion of the content addressable memory and selectively reducing power to the at least a portion of the content addressable memory when valid data does not exist in the at least a portion of the content addressable memory.

In still another particular embodiment, a wireless device includes a receiver and a content addressable memory. The wireless device also includes a processor responsive to the receiver and coupled to the content addressable memory. The processor includes a first register and power control logic, and the processor is adapted to selectively reduce power to at least a portion of the content addressable memory after determining that valid data does not exist in at least a portion of the content addressable memory.

One particular advantage provided by embodiments of the described systems and methods is that power can be saved when searching a CAM. Another particular advantage of the described systems and methods is that a search speed of a CAM may be increased.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 1:
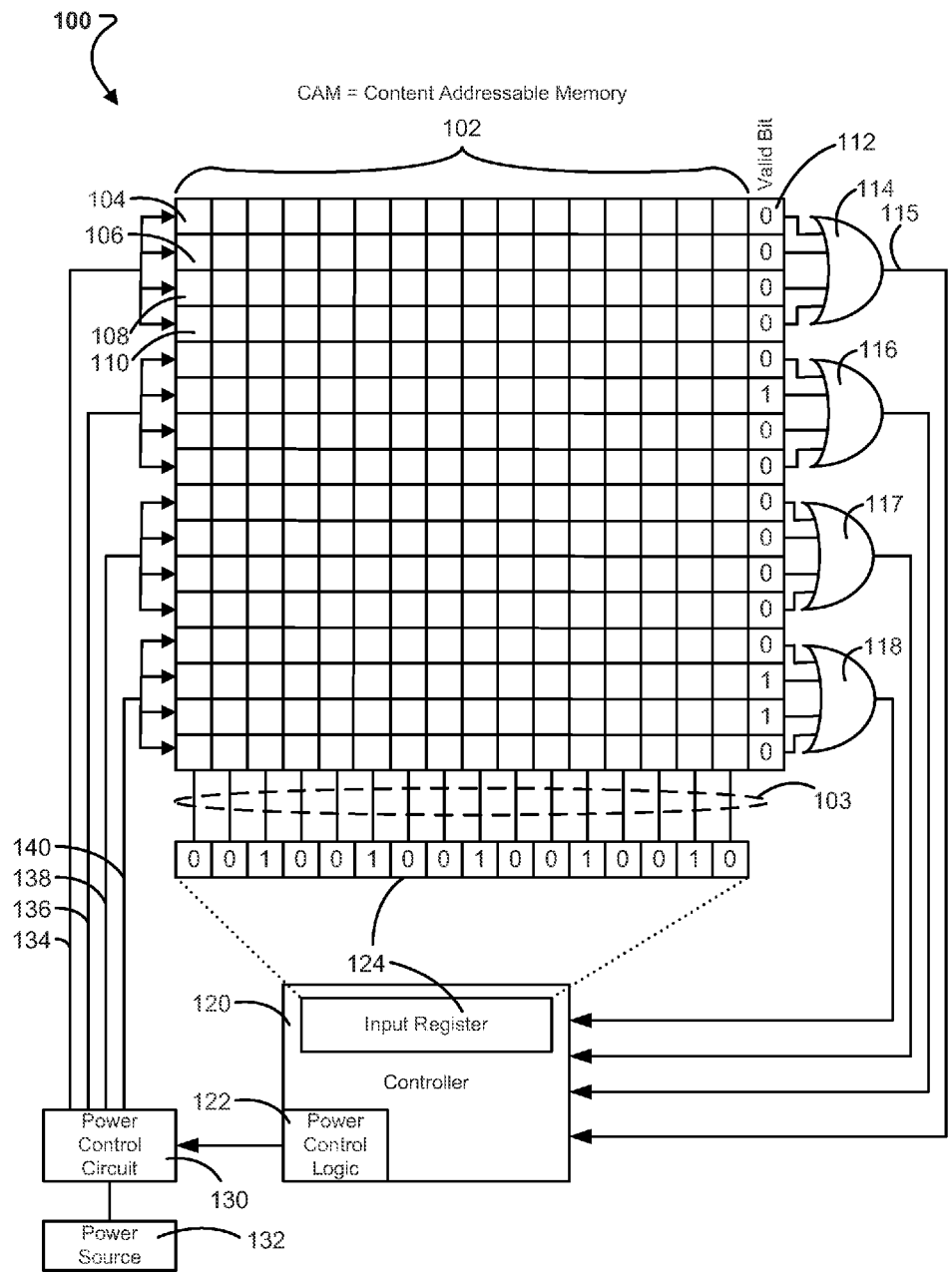
FIG. 1 is a block diagram of a particular embodiment of a system for reducing power usage of a content addressable memory.
Figure 2:
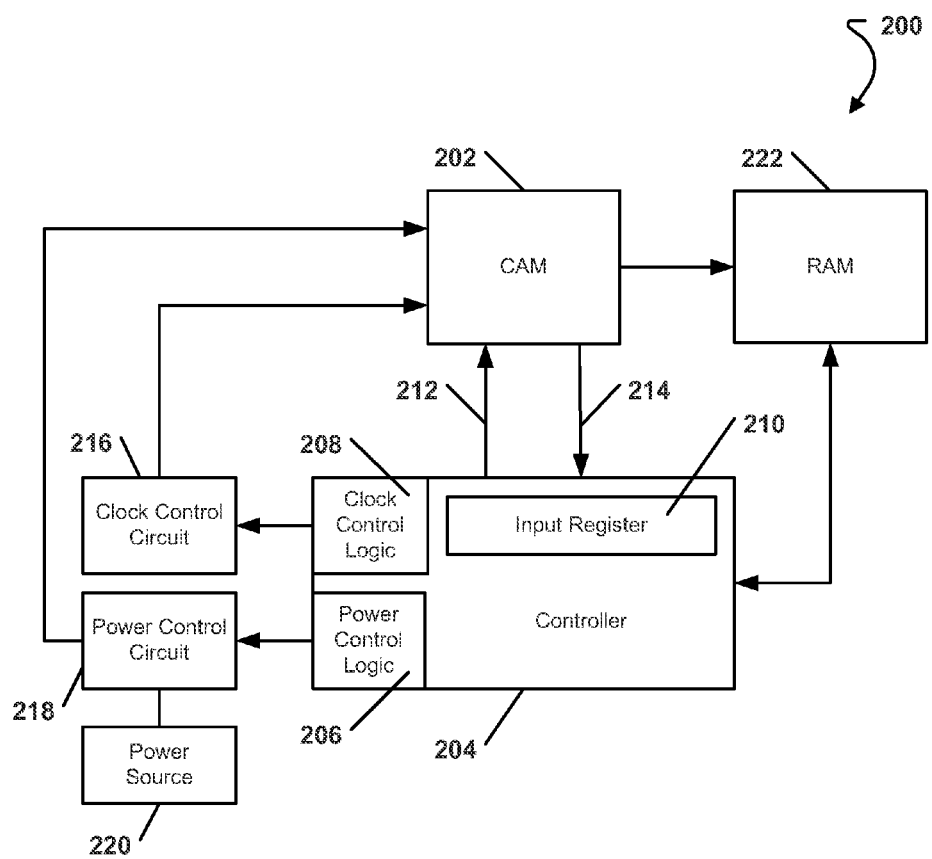
FIG. 2 is a block diagram of another particular embodiment of a system for reducing power usage of a content addressable memory.
Figure 3:
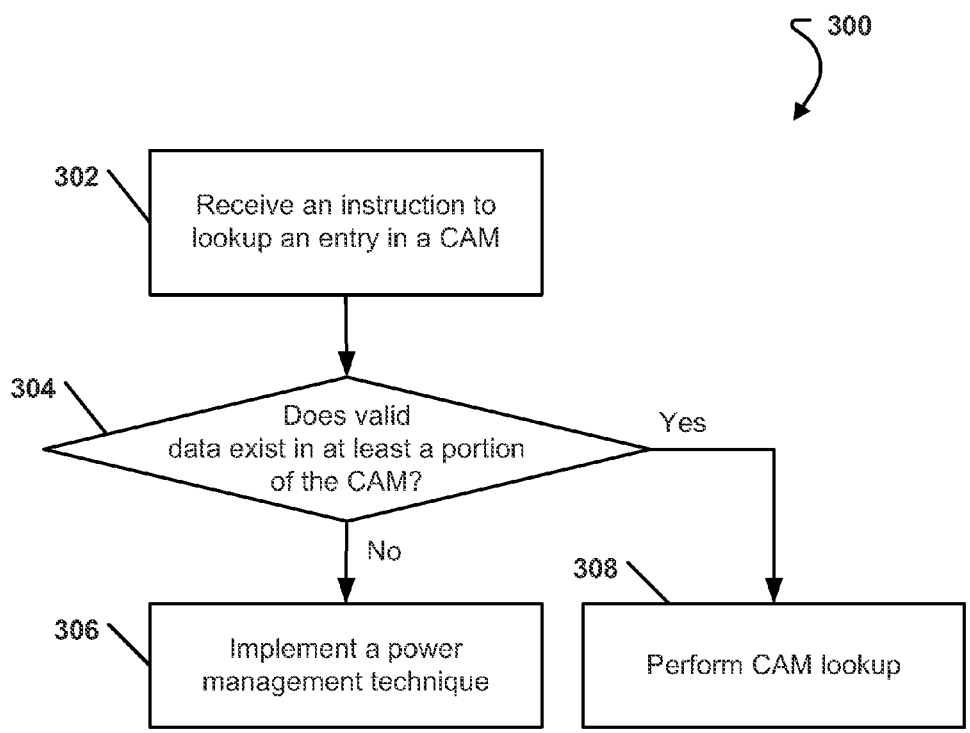
Figure 4:
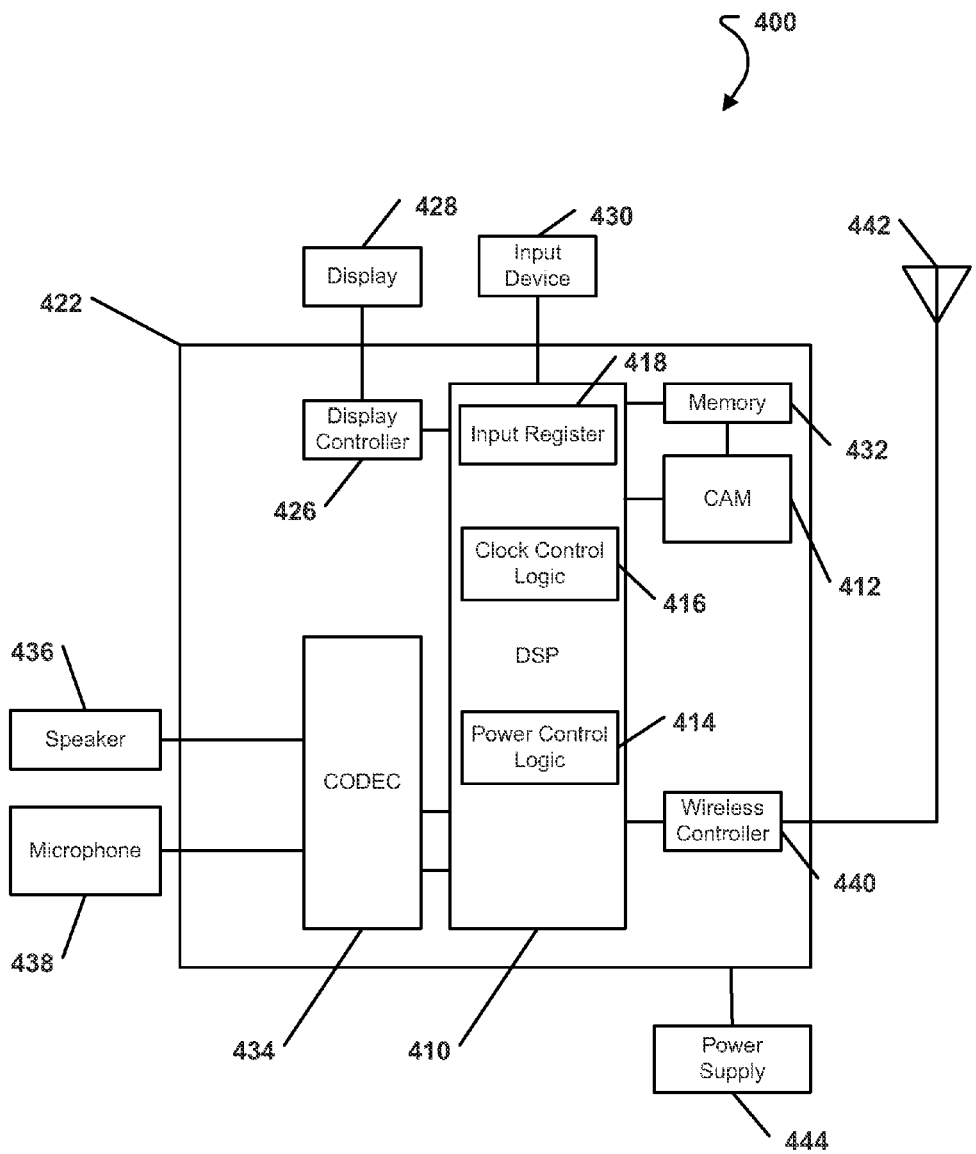

FIG. 3 is a flow chart of a particular embodiment of a method of reducing power usage of a content addressable memory; and FIG. 4 is an exemplary embodiment of a portable communication device that may utilize a device for reducing power usage of a content addressable memory and implement a method for reducing power usage of a content addressable memory, such as that described with respect to FIGS. 1-3.

V. DETAILED DESCRIPTION

FIG. 1 illustrates a block diagram of a particular embodiment of a system 100 for reducing power usage of a content addressable memory 102. The system 100 includes the content addressable memory (CAM) 102. The CAM 102 may include multiple data cells, such as data cells 104, 106, 108, and 110. The data cells 104, 106, 108, and 110 may each contain a single bit and each row of the CAM 102 may constitute a data word. Each row in the CAM 102 can also include a valid bit, such as valid bit 112. The valid bit may signify whether data stored in a corresponding row is valid or not. In a specific embodiment, when the valid bit is equal to one, the data in the corresponding row is valid and when the valid bit is equal to zero, the data in the corresponding row is not valid.

The system 100 also includes a first OR gate 114 coupled to outputs of a first bank of rows of the CAM 102. A bank of rows may include one or more rows of the CAM 102 and there may be one output for each row in the bank. As depicted, the first bank of rows may include four rows. Additionally, the system 100 may also include a second OR gate 116, a third OR gate 117, and a fourth OR gate 118 that may each be coupled to one or more rows. Each OR gate may correspond to a different bank of rows of the CAM 102. In a particular embodiment, the CAM 102 includes thirty-two (32) rows and there are eight (8) OR gates, each OR gate coupled to a corresponding bank of four rows.

The CAM 102 may also include parallel input lines 103 coupled to an input register 124 that can store a data word. The input register 124 may be implemented in a controller 120. The controller 120 can include power control logic 122. The power control logic 122 may be coupled to a power control circuit 130. The power control circuit 130 can be coupled to a power source 132. The power control circuit 130 may include multiple switches to selectively disable power to one or more of a first power connection 134, a second power connection 136, a third power connection 138, and a fourth power connection 140. Each power connection may provide power to a specific bank of rows of the CAM 102. The power control circuit 130 and the power control logic 122 may selectively reduce power to a first bank of rows independent of a second bank of rows.

During operation, the controller 120 may receive an instruction to lookup an entry in the CAM 102. The controller 120 may store the entry as a data word in the input register 124. The controller 120 may also determine when valid data exists in the CAM 102. For example, an input of the first OR gate 114 may receive the valid bit 112 for each of the rows in the bank corresponding to the first OR gate 114. The first OR gate 114 may provide an output 115 that is coupled to the controller 120. If any of the valid bits 112 in the rows corresponding to the first OR gate 114 indicate that valid data exists in the row, then the output 115 will indicate that valid data exists in the bank of rows corresponding to the first OR gate 114. If none of the valid bits 112 in the rows corresponding to first OR gate 114 indicate that valid data exists in the row, then the output 115 will indicate that valid data does not exist in the bank of rows corresponding to the first OR gate 114. In another particular embodiment, the controller 120 may determine when valid exists in a bank in the CAM 102 based on a copy of the valid bits stored in a shadow register. The shadow register may be internal to the controller 120 or may be a separate memory accessible by the controller 120.

When valid data does not exist in a bank of rows, the controller 120 may implement a power management technique for such bank. The power management technique may include disabling power to the bank of rows via the power control logic 122. The power control logic 122 may reduce the power to the bank of rows when valid data does not exist in the bank of rows. The power control logic 122 may further direct the power control circuit 130 to reduce or disable power from the bank of rows. The power control circuit 130 may disable a foot switch or a head switch to the bank of rows. The bank of rows may include a single row, multiple rows, or all rows of the CAM 102.

The controller 120 may reduce or disable power to any of the banks of rows or any combination of the banks of rows. When no valid data exists in all of the rows of the CAM 102, the controller 120 may reduce the power consumption of the CAM 102 by not toggling the input lines 103 such that the input lines 103 do not receive a data word from the input register 124. The controller 120 may also disable a clock signal input of the CAM 102.

When valid data exists in the CAM 102, the controller 120 may toggle the parallel input lines 103 so that the data word stored in the input register 124 is passed to the CAM 102. The CAM 102 may compare the data word to each powered row of the CAM 102. Rows that are not powered may not be compared to the data word.

In a particular embodiment, the controller 120 may selectively move a row of the CAM 102 that has valid data from a first bank of the CAM 102 to a second bank of the CAM 102. The controller 120 may then reduce power to the first bank of the CAM 102 when no valid data exists in the first bank, while allowing power to the second bank of the CAM 102.

FIG. 2 illustrates a block diagram of another embodiment of a system 200 for reducing power usage of a content addressable memory (CAM) 202. The CAM 202 may be coupled to a controller 204 and to a random access memory 222. The CAM 202 may also be coupled to a clock control circuit 216 and to a power control circuit 218. The clock control circuit 216 may also be coupled to clock control logic 208. The clock control logic 208 may be integrated in the controller 204 or may be implemented using separate logic components. The power control circuit 218 may be coupled to a power source 220 and to power control logic 206. The power control logic 206 may be integrated in the controller 204 or may be implemented using separate logic components. The controller 204 may include an input register 210.

During operation, the controller 204 may store a data word in the input register 210. The controller 204 may receive an indication from the CAM 202 via input 214 if valid data exists in the CAM 202. The indication may include one or more signals indicating if a valid bit in a corresponding bank has been set. A bank may be a single row, multiple rows, or all rows of the CAM 202. In a particular embodiment, there are multiple banks, each having multiple rows in the CAM 202. Each bank of the CAM 202 may have one valid bit for each row in the corresponding bank. The valid bit can indicate whether valid data exists in the corresponding row. If any valid bit in a bank indicates that there is valid data in the bank, a corresponding signal sent to the input 214 will indicate that valid data exists in that bank.

When valid data does not exist in a bank, the controller 204 may implement a power management technique. The power management technique may include disabling power to the bank via the power control logic 206. The power control logic 206 may direct the power control circuit 218 to reduce or disable power to the bank that does not have valid data. The power control circuit 218 may disable a foot switch or a head switch to the bank.

The controller 204 may reduce or disable power to any of the multiple banks or any combination of the multiple banks. When valid data does not exist in any of the banks of the CAM 202, the controller 204 may reduce the power consumption of the CAM 202 by not allowing the data word stored in the input register 210 to be sent to the CAM 202 for searching.

The controller 204 may reduce power consumption of the CAM 202 by disabling a clock signal input of the CAM 202. The clock control logic 208 may disable the clock signal input to a bank via the clock control circuit 216 when valid data does not exist in the bank.

When valid data exists in the CAM 202, the controller 204 may send the data word stored in the input register 210 to the CAM 202 via output 212. The CAM 202 may be searched for the data word. The CAM 202 may compare the data word to each row of each bank of the CAM 202 that has not had its power reduced or disabled. Rows that have reduced power or disabled power may not be compared to the data word.

When a row in the CAM 202 matches the data word from the input register 210, the match may indicate that an address location of the RAM 222 exists in the CAM 202. The controller 204 may then retrieve data from the address location of the RAM 222. When there is valid data in a bank of the CAM 202 and the CAM 202 does not find a match to the data word, the CAM 202 returns a not found message to the controller 204.

FIG. 3 illustrates a flow chart of a particular embodiment of a method 300 of reducing power usage of a content addressable memory. The method 300 includes receiving an instruction to lookup an entry in a content addressable memory (CAM), at 302. The CAM may include multiple banks, each bank having multiple rows for storing data words.

The method 300 also includes determining when valid data exists in at least a portion of the content addressable memory, at 304. The portion of the content addressable memory may include a single row, multiple rows, or all of the CAM. In a particular embodiment, determining when valid data exists may be based on an evaluation of a valid data bit. The CAM may include a valid data bit for each row of the CAM. In another particular embodiment, valid data exists in a row when the corresponding valid data bit equals one and valid data does not exist in the row when the corresponding valid data bit equals zero.

The method 300 further includes implementing a power management technique when valid data does not exist in the at least a portion of the content addressable memory, at 306. The power management technique may include disabling power to the at least a portion of the content addressable memory. The power management technique may also include disabling a clock signal to the at least a portion of the content addressable memory. The power management technique may further comprise disabling a foot switch or a head switch to the at least a portion of the content addressable memory. The power management technique may also include not allowing a search input to the CAM when valid data does not exist in the CAM. The method may further include performing a CAM lookup at 308 when valid data exists in at least a portion of the CAM.

FIG. 4 illustrates an exemplary, non-limiting embodiment of a portable communication device that may utilize a system for reducing power usage of a content addressable memory (CAM) and a method of reducing power usage of a CAM, such as that described with respect to FIGS. 1-3, and is generally designated 400. The portable communications device 400 includes an on-chip system 422 that includes a processor, such as a digital signal processor 410 having an input register 418, clock control logic 416, and power control logic 414. FIG. 4 also shows a display controller 426 that may be coupled to the digital signal processor 410 and to a display 428. Moreover, an input device 430, such as a keypad or a selection device, may be coupled to the digital signal processor 410. Additionally, a content addressable memory (CAM) 412 and a memory 432 are coupled to the digital signal processor 410. A coder/decoder (CODEC) 434 can also be coupled to the digital signal processor 410. A speaker 436 and a microphone 438 can be coupled to the CODEC 434.

FIG. 4 also indicates that a wireless controller 440 can be coupled to the digital signal processor 410 and to a wireless antenna 442. In a particular embodiment, a power supply 444 is coupled to the on-chip system 422. In a particular embodiment, as illustrated in FIG. 4, the display 428, the input device 430, the speaker 436, the microphone 438, the wireless antenna 442, and the power supply 444 are external to the on-chip system 422. However, each is coupled to a component of the on-chip system 422.

In a particular illustrative embodiment, the input register 418 may receive a data word to search in the CAM 412. The DSP 410 may determine when valid data exists in at least a portion of the CAM 412. The power control logic 414 may implement a power management technique when valid data does not exist in the at least a portion of the CAM 412. The power control logic 414 may reduce or disable power to one or more portions of the CAM 412. The clock control logic 416 may disable a clock signal to the CAM 412 when no valid data exists in the CAM 412. Also, the DSP 418 may not initiate a search of the CAM 412 for the data word when no valid data exists in the CAM 412.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method comprising:
receiving an instruction to lookup an entry in a content addressable memory that includes multiple rows;
determining, at a controller, whether valid data exists in a particular set of rows that includes at least two rows of the multiple rows by receiving, at the controller, a one-bit input representing the particular set of rows, wherein the one-bit input is formed based on valid data bits, and wherein each of the valid data bits indicates whether valid data exists in a corresponding row of the particular set of rows; and
implementing a power management technique when the one-bit input indicates that valid data does not exist in the particular set of rows, wherein the power management technique comprises disabling the particular set of rows.

2. The method of claim 1, wherein the power management technique further comprises disabling power to the particular set of rows that has no valid data.

3. The method of claim 2, wherein, when valid data does not exist in the content addressable memory, the power management technique further comprises disabling power to all of the content addressable memory.

4. The method of claim 1, wherein the power management technique further comprises disabling a clock signal to the particular set of rows that has no valid data.

5. The method of claim 1, wherein the content addressable memory includes a valid data bit for each row of the content addressable memory.

6. The method of claim 5, wherein valid data exists in a row of the content addressable memory when a corresponding valid data bit equals one and valid data does not exist in the row when the corresponding valid data bit equals zero.

7. The method of claim 5, wherein the valid data bits are stored in a shadow register.

8. The method of claim 1, further comprising not allowing a search input to the content addressable memory when valid data does not exist in the content addressable memory.

9. A system comprising:
a content addressable memory that includes multiple rows;
an input register configured to store a data word, wherein the content addressable memory is configured to determine if the data word exists in the content addressable memory;
a controller coupled to the content addressable memory, wherein the controller is configured to determine whether valid data exists in a first set of rows that includes at least two rows of the multiple rows by receiving, at the controller, a one-bit input representing the first set of rows, wherein the one-bit input is formed based on valid data bits, and wherein each of the valid data bits indicates whether valid data exists in a row of the first set of rows;
a power control circuit coupled to the content addressable memory and configured to selectively provide power to the first set of rows; and
power control logic coupled to the power control circuit, wherein the power control logic is configured to disable the first set of rows when the one-bit input indicates that the first set of rows has no valid data.

10. The system of claim 9, wherein the content addressable memory is divided into two or more sets of rows, wherein each set of rows comprises at least two rows, and wherein the power control circuit is configured to selectively reduce power of a second set of rows independent of a third set of rows when a second one-bit input indicates that the second set of rows has no valid data and a third one-bit input indicates that the third set of rows has valid data.

11. The system of claim 9, wherein the controller is coupled to the content addressable memory, the input register, and the power control logic, wherein the controller is configured to determine whether valid data exists in a second set of rows of the multiple rows, and the power control circuit is configured to selectively reduce power to the second set of rows when valid data does not exist in the second set of rows.

12. The system of claim 11, further comprising a clock control circuit coupled to the controller, wherein the clock control circuit is configured to selectively control a clock signal, wherein the controller is configured to disable the clock signal to the first set of rows when the first set of rows has no valid data.

13. The system of claim 11, wherein the controller is configured to: disable a clock input to the content addressable memory, not provide a search input to the content addressable memory, or reduce power to the content addressable memory when no valid data exists in the content addressable memory.

14. The system of claim 11, wherein the controller is configured to:
selectively move a row of valid data of the content addressable memory from a third set of rows of the content addressable memory to a fourth set of rows of the content addressable memory; and
reduce power to the third set of rows when no valid data exists in the third set of rows.

15. The system of claim 9, further comprising a random access memory coupled to the content addressable memory, the random access memory having addressable data storage locations, wherein the content addressable memory is configured to store addresses for the addressable data storage locations.

16. A device comprising:
a content addressable memory that includes multiple rows;
a power control circuit coupled to the content addressable memory;
means for determining whether valid data exists in a particular set of rows that includes at least two rows of the multiple rows by receiving, at the means for determining, a one-bit input representing the particular set of rows, wherein the one-bit input is formed based on valid data bits, and wherein each of the valid data bits indicates whether valid data exists in a corresponding row of the particular set of rows; and
means for disabling the particular set of rows when the one-bit input indicates that the particular set of rows does not have valid data.

17. A wireless device comprising:
a receiver;
a content addressable memory that includes multiple rows; and
a processor responsive to the receiver and coupled to the content addressable memory, wherein the processor includes a first register and power control logic,
wherein the processor is configured to cause a particular set of rows that includes at least two rows of the multiple rows to be disabled after determining that valid data does not exist in the particular set of rows by receiving, at the processor, a one-bit input representing the particular set of rows, wherein the one-bit input is formed based on valid data bits, and wherein each of the valid data bits indicates whether valid data exists in a corresponding row of the particular set of rows.

18. The wireless device of claim 17, further comprising:
an antenna coupled to the receiver;
a transmitter coupled to the antenna;
a random access memory accessible by the processor;
a display controller coupled to the processor; and
an audio coder/decoder (CODEC) coupled to the processor.

19. The method of claim 1, wherein the one-bit input is formed by a logical OR of the valid data bits.

20. The method of claim 1, wherein the power management technique further comprises reducing power consumption of the particular set of rows that has no valid data.

21. The system of claim 9, wherein the one-bit input is formed by a logical OR of the valid data bits.

22. The system of claim 9, wherein the power control logic is further configured to selectively reduce power consumption of the first set of rows when the first set of rows has no valid data.

23. The device of claim 16, wherein the one-bit input is formed by a logical OR of the valid data bits.

24. The wireless device of claim 17, wherein the one-bit input is formed by a logical OR of the valid data bits.

25. The method of claim 1, wherein the power management technique further comprises disabling a head switch, a foot switch, or both, to the particular set of rows that has no valid data.

26. The system of claim 9, wherein the power control logic is configured to disable a head switch, a foot switch, or both, to disable the first set of rows when the first set of rows has no valid data.

27. The device of claim 16, wherein the means for disabling the particular set of rows comprises means for disabling a head switch, a foot switch, or both, to disable the particular set of rows when the particular set of rows does not have valid data.

28. The wireless device of claim 17, wherein the processor is configured to disable a head switch, a foot switch, or both, to disable the particular set of rows that has no valid data.

29. A non-transitory computer-readable medium storing instructions that, when executed by a processor, cause the processor to:

transmit an instruction to lookup an entry in a content addressable memory that includes multiple rows;

determine whether valid data exists in a particular set of rows that includes at least two rows of the multiple rows by receiving a one-bit input representing the particular set of rows, wherein the one-bit input is formed based on valid data bits, and wherein each of the valid data bits indicates whether valid data exists in a corresponding row of the particular set of rows; and implement a power management technique when the one-bit input indicates that valid data does not exist in the particular set of rows, wherein the power management technique comprises disabling the particular set of rows.

30. The method of claim 1, wherein the one-bit input indicates that valid data exists in the particular set of rows when at least one row of the particular set of rows contains valid data and at least one row of the particular set of rows does not contain valid data.

* * * * *